United States Patent
Shi et al.

(10) Patent No.: US 12,404,168 B2
(45) Date of Patent: Sep. 2, 2025

(54) MEMS DEVICE

(71) Applicant: HUAWEI TECHNOLOGIES CO., LTD., Guangdong (CN)

(72) Inventors: Qin Shi, Nanjing (CN); Qifang Hu, Shenzhen (CN); Anping Qiu, Nanjing (CN); Jinghui Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 418 days.

(21) Appl. No.: 18/161,310

(22) Filed: Jan. 30, 2023

(65) Prior Publication Data

US 2023/0174371 A1 Jun. 8, 2023

Related U.S. Application Data

(63) Continuation of application No. PCT/CN2021/108477, filed on Jul. 26, 2021.

(30) Foreign Application Priority Data

Jul. 31, 2020 (CN) .......................... 202010761268.2

(51) Int. Cl.
*B81B 7/00* (2006.01)
*B81C 1/00* (2006.01)

(52) U.S. Cl.
CPC ........ *B81B 7/0048* (2013.01); *B81C 1/00888* (2013.01); *B81B 2201/0235* (2013.01); *B81B 2201/0242* (2013.01)

(58) Field of Classification Search
None
See application file for complete search history.

(56) References Cited

U.S. PATENT DOCUMENTS

| | | |
|---|---|---|
| 5,503,016 A | 4/1996 | Koen |
| 6,265,773 B1 | 7/2001 | Kinsman et al. |
| 8,368,154 B2 | 2/2013 | Trusov et al. |

(Continued)

FOREIGN PATENT DOCUMENTS

| | | |
|---|---|---|
| CN | 207265035 U | 4/2018 |
| CN | 109655636 A | 4/2019 |

(Continued)

OTHER PUBLICATIONS

Zotov, S.A. et al: "Folded MEMS Pyramid Inertial Measurement Unit." IEEE Sensors Journal, vol. 11, No. 11, Nov. 2011. doi: 11.10.1109/JSEN.2011.2160719, total 10 pages.

(Continued)

*Primary Examiner* — Anthony Ho

(57) ABSTRACT

An MEMS device includes a package, a bottom plate, and a first inertial component. The first inertial component is located in packaging space formed by the bottom plate and the package. There is a first alignment part on a surface that is of the bottom plate and that faces the packaging space, and the first inertial component has a first mounting part. A shape of the first mounting part matches a shape of the first alignment part. The MEMS device is equipped with a mounting alignment reference, the first mounting part is connected to the first alignment part, and the first inertial component is mounted on the bottom plate at a preset angle. In addition, a bottom part of the first inertial component is not directly connected to the bottom plate.

14 Claims, 5 Drawing Sheets

(56) References Cited

U.S. PATENT DOCUMENTS 8,624,380 B2    1/2014   Xue et al.
8,836,132 B2    9/2014   Xue

FOREIGN PATENT DOCUMENTS

KR      930004417 A      3/1993
KR      20030095436 A    12/2003

OTHER PUBLICATIONS

R. M. Noor, V. Gundeti and A. M. Shkel, "A status on components development for folded micro NMR gyro," 2017 IEEE International Symposium on Inertial Sensors and Systems (INERTIAL), Kauai, HI, USA, Mar. 27-30, 2017, pp. 156-159, doi: 10.1109/ISISS.2017.7935691.

A. Efimovskaya, Y.-W. Lin and A. M. Shkel, "Double-Sided Process for MEMS SOI Sensors With Deep Vertical Thru-Wafer Interconnects," in Journal of Microelectromechanical Systems, vol. 27, No. 2, pp. 239-249, Apr. 2018, doi: 10.1109/JMEMS.2017.2786663.

A. Efimovskaya, Y.-W. Lin and A. M. Shkel, "Origami-Like 3-D Folded MEMS Approach for Miniature Inertial Measurement Unit," in Journal of Microelectromechanical Systems, vol. 26, No. 5, pp. 1030-1039, Oct. 2017, doi: 10.1109/JMEMS.2017.2703594.

W. Zhu, C. S. Wallace and N. Yazdi, "A tri-fold inertial measurement unit fabricated with a batch 3-D assembly process," 2016 IEEE International Symposium on Inertial Sensors and Systems, Laguna Beach, CA, USA, Feb. 22-25, 2016, pp. 70-73, doi: 10.1109/ISISS.2016.7435547.

PCT International Search Report for Application No. PCT/CN2021/108477 dated Jul. 26, 2021, 10 pages.

MEMS DEVICE

CROSS-REFERENCE TO RELATED APPLICATIONS

This application is a continuation of International Application No. PCT/CN2021/108477, filed on Jul. 26, 2021, which claims priority to Chinese Patent Application No. 202010761268.2, filed on Jul. 31, 2020. The disclosures of the aforementioned applications are hereby incorporated by reference in their entireties.

TECHNICAL FIELD

This application relates to the field of electronic technologies, and in particular, to a micro electro mechanical system (MEMS) device.

BACKGROUND

An accelerometer or a gyroscope that is manufactured based on a micro electro mechanical system (MEMS) is a sensor based on a principle of inertia sensitivity, and may be referred to as an inertial device. A sensing system including three accelerometers and three gyroscopes that are mounted orthogonally may be referred to as an inertial measurement unit (IMU).

For an inertial measurement unit with high precision, to ensure detection precision of inertia force in each axial direction, an inertial structure that responds only to a single axis is generally used. Specifically, three-axis assembly is used: Three gyroscopes (axial directions are separately an X-axis, a Y-axis, and a Z-axis) are orthogonally mounted, and three accelerometers (axial directions are separately the X-axis, the Y-axis, and the Z-axis) are orthogonally mounted. In this case, an inertial device whose axial directions are the X-axis and the Y-axis needs to be vertically mounted on a bottom plate.

In a related technology, an inertial device is first horizontally placed in a package that can be vertically mounted, and then the package is vertically welded on a bottom plate, so that the inertial device is vertically mounted on the bottom plate. There are two problems in this vertical mounting mode. In one aspect, the process associated with the vertical mounting mode is extremely difficult and mounting costs are high. In another aspect, a mounting error is relatively large, and calibration and compensation costs in later testing are relatively high.

SUMMARY

This application provides a MEMS device unit, so that problems of high costs and low precision of a MEMS device can be resolved.

According to one aspect, a MEMS device is provided. The MEMS device includes a package, a bottom plate, and a first inertial component. The bottom plate and the package form packaging space, and the first inertial component is located in the packaging space. There is a first alignment part on a surface that is of the bottom plate and that faces the packaging space, the first inertial component has a first mounting part, and a shape of the first mounting part matches a shape of the first alignment part. The first mounting part is connected to the first alignment part, to mount the first inertial component on the bottom plate at a preset angle. The preset angle is greater than 0 degrees and less than 180 degrees.

In this application, after the first mounting part in the first inertial component is connected to the first alignment part on the surface that is of the bottom plate and that faces the packaging space, the first inertial component is mounted on the bottom plate at the preset angle. In other words, the MEMS device in this application is equipped with a mounting alignment reference, and therefore, the first inertial component can be mounted on the bottom plate at the preset angle. A process is simple and mounting costs are relatively low: In addition, because the first inertial component is mounted on the bottom plate at the preset angle, and a bottom part of the first inertial component is not directly connected to the bottom plate, this reduces bias errors caused by packaging stress. In addition, because flatness and angle precision of both the first mounting part and the first alignment part are relatively high, this reduces an assembly error, so that calibration and compensation costs in later testing can be reduced.

The first inertial component is a sensor based on a principle of inertia sensitivity, for example, may be an accelerometer or a gyroscope, or may be a combination of an accelerometer and a gyroscope. The first inertial component may be a single-axis inertial component, for example, may include at least one of a single-axis gyroscope or a single-axis accelerometer. Alternatively, the first inertial component may be a multi-axis inertial component, for example, may include at least one of a multi-axis gyroscope or a multi-axis accelerometer. Alternatively, the first inertial component may include a single-axis gyroscope and a multi-axis accelerometer. Alternatively, the first inertial component may include a multi-axis gyroscope and a single-axis accelerometer.

That a shape of the first mounting part matches a shape of the first alignment part means that an angle of a corner of the first mounting part is the same as an angle of a corner of the first alignment part, and the corner of the first mounting part and the corner of the first alignment part are concave and convex: in other words, one of the corner of the first mounting part and the corner of the first alignment part is convex, and the other is concave. In this way, the corner of the first mounting part and the corner of the first alignment part can be fully engaged: in other words, the first mounting part and the first alignment part can be accurately aligned and connected.

The corner of the first mounting part is a portion at which edges of the first mounting part are connected. The corner of the first mounting part generally includes two adjacent surfaces in the first mounting part, and the angle of the corner of the first mounting part is an included angle between the two surfaces. The corner of the first alignment part is a portion at which edges of the first alignment part are connected. The corner of the first alignment part generally includes two adjacent surfaces in the first alignment part, and the angle of the corner of the first alignment part is an included angle between the two surfaces.

The mounting the first inertial component on the bottom plate at the preset angle means that after the first inertial component is mounted on the bottom plate, an included angle between a stacking surface of the first inertial component and the surface that is of the bottom plate and that faces the packaging space is the preset angle. The stacking surface of the first inertial component is a surface on which layers of the first inertial component are stacked with adjacent layers.

The angle of the corner of the first mounting part and the angle of the corner of the first alignment part may be the same as or different from the preset angle. In a possible implementation, both the angle of the corner of the first mounting part and the angle of the corner of the first alignment part are the same as the preset angle. In this implementation, an angle at which the first inertial component is mounted on the bottom plate is the same as the angle of the corner of the first mounting part and the angle of the corner of the first alignment part. In another possible implementation, neither the angle of the corner of the first mounting part nor the angle of the corner of the first alignment part is necessarily related to the preset angle: in other words, the first inertial component is mounted on the bottom plate at a fixed preset angle regardless of the angle of the corner of the first mounting part and the angle of the corner of the first alignment part.

Optionally; the preset angle is 90 degrees: in other words, the first inertial component is mounted on the bottom plate at 90 degrees. In other words, after the first inertial component is mounted on the bottom plate, the included angle between the stacking surface of the first inertial component and the surface that is of the bottom plate and that faces the packaging space is 90 degrees. In this case, the first inertial component is vertically mounted on the bottom plate.

Further, the MEMS device further includes a second inertial component, and the second inertial component is located in the packaging space. There is a second alignment part on the surface that is of the bottom plate and that faces the packaging space, the second inertial component has a second mounting part, and a shape of the second alignment part matches a shape of the second mounting part. The second mounting part is connected to the second alignment part, to mount the second inertial component on the bottom plate at the preset angle.

The second inertial component is a sensor based on the principle of inertia sensitivity, for example, may be an accelerometer or a gyroscope, or may be a combination of an accelerometer and a gyroscope. The second inertial component may be a single-axis inertial component, for example, may include at least one of a single-axis gyroscope or a single-axis accelerometer. Alternatively, the second inertial component may be a multi-axis inertial component, for example, may include at least one of a multi-axis gyroscope or a multi-axis accelerometer. Alternatively, the second inertial component may include a single-axis gyroscope and a multi-axis accelerometer. Alternatively, the second inertial component may include a multi-axis gyroscope and a single-axis accelerometer.

An axial direction of the first inertial component is different from an axial direction of the second inertial component. For example, the axial direction of the first inertial component may be a horizontal X-axis, and the axial direction of the second inertial component may be a horizontal Y-axis. In this way, the second inertial component and the first inertial component may detect inertia force in different axial directions.

In this application, because the first inertial component and the second inertial component are packaged in a same package, a quantity of used packaging packages is reduced, packaging costs are significantly reduced, a packaging volume is reduced, and an integration level is improved.

The MEMS device further includes a third inertial component, and the third inertial component is located in the packaging space. The third inertial component is mounted on the bottom plate, and a stacking surface of the third inertial component is parallel to the surface that is of the bottom plate and that faces the packaging space. In this way, the third inertial component is horizontally mounted on the bottom plate. In this case, a bottom part of the third inertial component is connected to the surface that is of the bottom plate and that faces the packaging space.

The third inertial component is a sensor based on the principle of inertia sensitivity, for example, may be an accelerometer or a gyroscope, or may be a combination of an accelerometer and a gyroscope. The third inertial component may be a single-axis inertial component, for example, may include at least one of a single-axis gyroscope or a single-axis accelerometer. Alternatively, the third inertial component may be a multi-axis inertial component, for example, may include at least one of a multi-axis gyroscope or a multi-axis accelerometer. Alternatively, the third inertial component may include a single-axis gyroscope and a multi-axis accelerometer. Alternatively, the third inertial component may include a multi-axis gyroscope and a single-axis accelerometer.

In a possible case, the third inertial component may be a single-axis inertial component, for example, an axial direction of the third inertial component may be a vertical Z-axis. The axial direction of the first inertial component may be the horizontal X-axis, and the axial direction of the second inertial component may be the horizontal Y-axis. In this way, precision of the MEMS device can be improved.

In another possible case, the third inertial component may be a multi-axis inertial component, for example, axial directions of the third inertial component may be the horizontal Y-axis and the vertical Z-axis, and the axial direction of the first inertial component may be the horizontal X-axis. In this way, a packaging volume can be reduced.

In this application, system in package (SIP) is used to perform three-dimensional assembly of a plurality of inertial components in same packaging space, so that an integration level is improved, and sizes of the MEMS device in three directions: the X-axis, the Y-axis, and the Z-axis are reduced. In this application, based on a precise mounting alignment technology, a plurality of existing packaging packages are reduced to only one packaging package, and costs and a volume are reduced while precision is ensured. In addition, a precise mounting alignment technology based on the bottom plate reduces a mounting error during multi-axis assembly, so that a cross-axis coupling error of the MEMS device is reduced. Therefore, not only difficulty of calibration and compensation in later testing can be reduced, and costs can be reduced, but performance consistency of the MEMS device can also be improved. In this way, a small-size, cost-effective, and high-precision MEMS device can be obtained.

Optionally, the first inertial component includes an inertial device, a flexible substrate, and a processor. The inertial device and a first portion of the flexible substrate are sequentially stacked with and connected to the processor, the inertial device has the first mounting part, and a second portion of the flexible substrate except the first portion is connected to the surface that is of the bottom plate and that faces the packaging space. A first electrode of the inertial device is electrically connected to a first output electrode of the processor, a second electrode of the inertial device is electrically connected to an input electrode of the processor, a second output electrode of the processor is electrically connected to an electrode of the first portion, the electrode of the first portion is electrically connected to an electrode of the second portion, and the electrode of the second portion is electrically connected to an electrode on the surface that is of the bottom plate and that faces the packaging space.

The flexible substrate can be bent, and the flexible substrate may be bent to form the first portion and the second portion. The first portion and the second portion of the flexible substrate are not in a same plane, and the first portion and the second portion form a specific angle. The angle may be the same as or close to the preset angle. In this way, the first portion of the flexible substrate is stacked with and connected to the inertial device and the processor, and the second portion of the flexible substrate is independent of the first portion of the flexible substrate and is connected to the surface that is of the bottom plate and that faces the packaging space.

In this case, an inertial signal in the inertial device is output to the processor. The processor processes the inertial signal, and outputs the processed inertial signal to the bottom plate by using the flexible substrate. In this way, when the first inertial component is mounted on the bottom plate at the preset angle, the inertial signal in the first inertial component can also be successfully output to the bottom plate. The associated process is simple and costs are relatively low.

Optionally, the inertial device includes a substrate layer, a first insulation layer, an inertial structure layer, a second insulation layer, and a cover layer. The substrate layer, the first insulation layer, the inertial structure layer, the second insulation layer, and the cover layer are sequentially stacked and connected, an input signal of the inertial structure layer is introduced from a first electrode of the first insulation layer, an output signal of the inertial structure layer is led out from a second electrode of the first insulation layer, the first electrode of the first insulation layer is electrically connected to the first output electrode of the processor, and the second electrode of the first insulation layer is electrically connected to the input electrode of the processor.

An area of the first insulation layer is greater than an area of the inertial structure layer, the first insulation layer includes a first edge region and a second edge region, and another region in the first insulation layer except the first edge region and the second edge region is stacked with and connected to the inertial structure layer. Both the first electrode and the second electrode of the first insulation layer are located in the first edge region. A surface near the inertial structure layer in the second edge region and a side surface near the second edge region in the inertial structure layer form the corner of the first mounting part.

Further, the MEMS device further includes a passive device. The passive device is located inside the bottom plate and is electrically connected between the electrode on the surface that is of the bottom plate and that faces the packaging space and a pin on a surface that is of the bottom plate and that is away from the packaging space. In addition, an active device is located on the surface that is of the bottom plate and that faces the packaging space, and is electrically connected between the electrode on the surface that is of the bottom plate and that faces the packaging space and the pin on the surface that is of the bottom plate and that is away from the packaging space.

In this application, the passive device may be buried in the bottom plate, and the active device may be attached to a surface, so that more devices can be integrated into limited packaging space to implement more functions and further improve an integration level.

According to another aspect, a MEMS device is provided, and the MEMS device includes a package, a bottom plate, and a first inertial component.

The bottom plate and the package form packaging space, and the first inertial component is located in the packaging space. The first inertial component is mounted on the bottom plate at a preset angle, and the preset angle is greater than 0 degrees and less than 180 degrees. The first inertial component includes an inertial device, a flexible substrate, and a processor. The inertial device and a first portion of the flexible substrate are sequentially stacked with and connected to the processor, and a second portion of the flexible substrate except the first portion is connected to a surface that is of the bottom plate and that faces the packaging space. A first electrode of the inertial device is electrically connected to a first output electrode of the processor, a second electrode of the inertial device is electrically connected to an input electrode of the processor, a second output electrode of the processor is electrically connected to an electrode of the first portion, the electrode of the first portion is electrically connected to an electrode of the second portion, and the electrode of the second portion is electrically connected to an electrode on the surface that is of the bottom plate and that faces the packaging space.

In this application, an inertial signal generated by the inertial device in the first inertial component is output to the processor. After processing the inertial signal, the processor may output the processed inertial signal to the bottom plate by using the flexible substrate. In this way, when the first inertial component is mounted on the bottom plate at the preset angle, the inertial signal in the first inertial component can also be successfully output to the bottom plate. The associated process is simple and costs are relatively low: In addition, because the first inertial component is mounted on the bottom plate at the preset angle, and a bottom part of the first inertial component is not directly connected to the bottom plate, this reduces bias errors caused by packaging stress.

Optionally, there is a first alignment part on the surface that is of the bottom plate and that faces the packaging space, the inertial device has a first mounting part, and a shape of the first mounting part matches a shape of the first alignment part. The first mounting part is connected to the first alignment part, to mount the first inertial component on the bottom plate at the preset angle.

DESCRIPTION OF EMBODIMENTS

Figure 1:
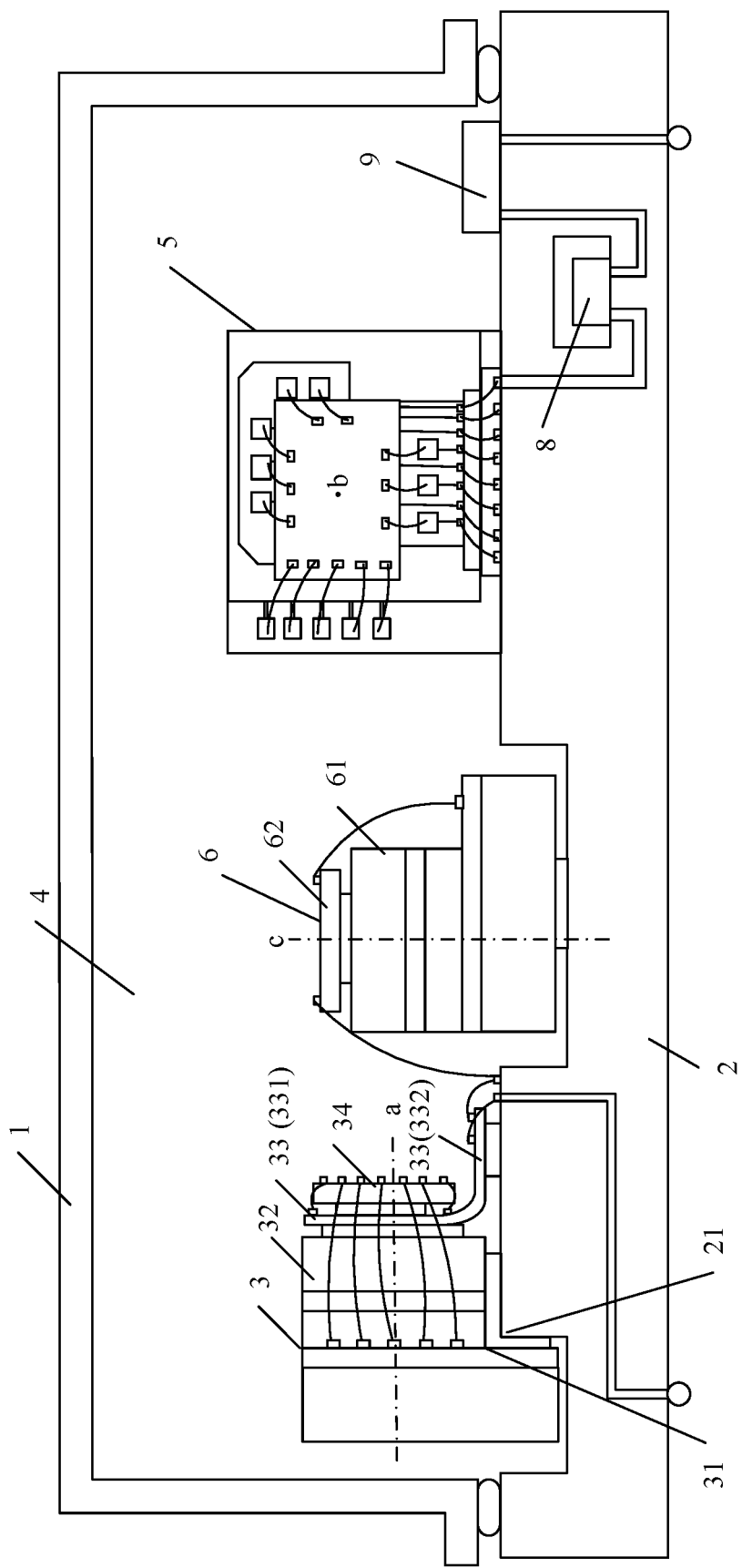
FIG. 1 is a schematic diagram of a structure of a MEMS device according to an embodiment of this application.

To make the objectives, technical solutions, and advantages of this application clearer, the following further describes the implementations of this application in detail with reference to the accompanying drawings.

It should be understood that "a plurality of" mentioned in this application means two or more. In the descriptions of this application, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, for ease of clearly describing the technical solutions in this application, words such as "first" and "second" are used to distinguish between same items or similar items with basically the same functions and basically the same effects. A person skilled in the art may understand that the terms such as "first" and "second" do not limit a quantity or an execution sequence, and the terms such as "first" and "second" do not indicate a definite difference.

Before embodiments of this application are explained and described in detail, application scenarios involved in embodiments of this application are described first.

A sensor for measuring a linear acceleration of an object is referred to as an accelerometer. After an acceleration signal is integrated once, a velocity signal is obtained, and after the acceleration signal is integrated twice, a displacement signal is obtained. A velocity and a displacement in space of an object in motion can be measured by orthogonally mounting three accelerometers on the object. A sensor for measuring a rotation velocity of an object is referred to as a gyroscope. Integration of an angular velocity signal with time is an angle signal. Rotation in space of an object in motion can be measured by orthogonally mounting three gyroscopes on the object. An accelerometer and a gyroscope that are manufactured based on a MEMS are sensors based on a principle of inertia sensitivity, and may be referred to as inertial devices. A sensing system including three accelerometers and three gyroscopes that are mounted orthogonally may be referred to as an inertial measurement unit.

The inertial measurement unit may be applied to a mobile phone, a smart household, an internet of things (IoT), an uncrewed vehicle, an uncrewed aerial vehicle, an intelligent robot, a logistics robot, a pod stabilization platform, and the like. For example, when the inertial measurement unit is applied to a mobile phone product end, functions such as lens stabilization, augmented reality (AR), and virtual reality (VR) may be implemented. When the inertial measurement unit is applied to a smart household (such as a sweeper or a housekeeping robot), a function such as path planning may be implemented, to improve cleaning coverage. When the inertial measurement unit is applied to a navigation field, the inertial measurement unit helps stabilize a posture, and implements uncrewed driving of a vehicle, an aircraft, and the like.

In a high-precision inertial measurement unit, bias stability over full temperature of a gyroscope is less than 30 deg/h (degrees/hour), and bias stability over full temperature of an accelerometer is less than 1 mg (milligram). A main difference between the high-precision inertial measurement unit and a low-precision inertial measurement unit is that the low-precision inertial measurement unit is generally integrated by a single chip in a plurality of axes: in other words, the single chip includes a three-axis accelerometer and a three-axis gyroscope: but to ensure detection precision of inertia force in each axial direction, the high-precision inertial measurement unit generally uses an inertial structure that is sensitive in a single axis. Specifically, the high-precision inertial measurement unit is assembled by using three axes, and three gyroscopes (axial directions are separately an X-axis, a Y-axis, and a Z-axis) are orthogonally mounted, and three accelerometers (axial directions are separately the X-axis, the Y-axis, and the Z-axis) are orthogonally mounted.

With the rise of an autonomous vehicle technology, there are increasingly more requirements for the high-precision inertial measurement unit in a vehicle-mounted navigation field. As a sensor that is used together with a global positioning system (GPS), the high-precision inertial measurement unit has advantages of high short-term precision and a high refresh rate, and makes up a disadvantage of a low refresh rate of the GPS.

In one aspect, the GPS is often affected by tall buildings, tunnels, overpasses, and dense woods on an urban road, and consequently cannot perform positioning. In this case, the high-precision inertial measurement unit can provide short-term (15 seconds to 1 minute) navigation positioning through dead reckoning. In another aspect, in a GPS update periodicity, it takes specific time from receiving a GPS signal to performing location and velocity calculation. Consequently, a deviation between a location and velocity calculation result and a real-time location and velocity is caused. Due to high short-term precision, the high-precision inertial measurement unit can compensate for a GPS delay error. In still another aspect, the high-precision inertial measurement unit may be configured to compensate for Doppler frequency shift of delta pseudo range measurement caused by a vehicle velocity, so that a GPS signal is quickly captured.

Currently, main problems of the high-precision inertial measurement unit are: 1. A packaging volume is relatively large and an integration level is low: 2. Packaging costs are relatively high, and packaging costs of the accelerometer and the gyroscope account for 60% to 80% of total costs. 3. An assembly error is relatively large, and calibration and compensation costs in later testing are relatively high.

Therefore, an embodiment of this application provides a MEMS device, so that an inertial component can be mounted in packaging space at a specific angle, and therefore a plurality of inertial components can be assembled in same packaging space in three dimensions. In this way, a small-size, cost-effective, and high-precision inertial measurement unit can be obtained.

FIG. 1 is a schematic diagram of a structure of a MEMS device according to an embodiment of this application. FIG. 1 is specifically a front sectional view of the MEMS device. As shown in FIG. 1, the MEMS device includes a package 1, a bottom plate 2, and a first inertial component 3.

The bottom plate 2 and the package 1 form packaging space 4, and the first inertial component 3 is located in the packaging space 4. There is a first alignment part 21 on a surface that is of the bottom plate 2 and that faces the packaging space 4, the first inertial component 3 has a first mounting part 31, and a shape of the first mounting part 31 matches a shape of the first alignment part 21. The first mounting part 31 is connected to the first alignment part 21, to mount the first inertial component 3 on the bottom plate 2 at a preset angle. The preset angle is greater than 0 degrees and less than 180 degrees.

An electrode of the first inertial component 3 may be electrically connected to an electrode on the surface that is of the bottom plate 2 and that faces the packaging space 4, and the electrode on the surface that is of the bottom plate 2 and that faces the packaging space 4 may be electrically connected to a pin on a surface that is of the bottom plate 2 and that is away from the packaging space 4. The surface that is of the bottom plate 2 and that faces the packaging space 4 may be generally referred to as an upper surface of the bottom plate 2, and the surface that is of the bottom plate 2 and that is away from the packaging space 4 may be generally referred to as a lower surface of the bottom plate 2.

The package 1 is a part configured to package an inertial component. The package 1 may be made of an insulating material. The package 1 may be a semi-closed structure, and there is a cavity inside the package 1. In this embodiment of this application, the bottom plate 2 may be connected to a bottom surface of the package 1: in other words, the bottom plate 2 is connected at an opening of the cavity of the package 1. In this case, the bottom plate 2 may close the cavity of the package 1, and the closed cavity is the packaging space 4. In this case, the inertial component mounted on the surface that is of the bottom plate 2 and that faces the packaging space 4 is located in the packaging space 4.

For example, an edge of one surface of the bottom plate 2 and an edge of the bottom surface of the package 1 may be connected (for example, are connected by using adhesive or the like). In this case, other portions of the surface of the bottom plate 2 except the edge are all located in the packaging space 4. An inertial component that is mounted on the other portions of the surface of the bottom plate 2 except the edge is also located in the packaging space 4.

The bottom plate 2 is a part configured to support the inertial component and lead out an electrical signal in the inertial component. The bottom plate 2 may be made of an insulating material, for example, the bottom plate 2 may be a ceramic or a printed circuit board (PCB). There is an electrode on the surface that is of the bottom plate 2 and that faces the packaging space 4, and the electrode on the surface that is of the bottom plate 2 and that faces the packaging space 4 may be electrically connected to an electrode of the inertial component, to transmit the electrical signal in the inertial component to the bottom plate 2. There is a pin on the surface that is of the bottom plate 2 and that is away from the packaging space 4, and the pin on the surface that is of the bottom plate 2 and that is away from the packaging space 4 and the electrode on the surface that is of the bottom plate 2 and that faces the packaging space 4 are electrically connected (for example, are electrically connected by using a connection wire). One or more electrodes on the surface that is of the bottom plate 2 and that faces the packaging space 4 and one or more pins on the surface that is of the bottom plate 2 and that is away from the packaging space 4 are connected in a one-to-one manner.

The pin on the surface that is of the bottom plate 2 and that is away from the packaging space 4 is an output end of the MEMS device. After an electrical signal in each inertial component is output to one or more electrodes on the surface that is of the bottom plate 2 and that faces the packaging space 4, the electrical signal is output by using one or more pins, connected to the one or more electrodes in a one-to-one manner, on the surface that is of the bottom plate 2 and that is away from the packaging space 4.

The first inertial component 3 is a sensor based on a principle of inertia sensitivity, for example, may be an accelerometer or a gyroscope, or may be a combination of an accelerometer and a gyroscope. The first inertial component 3 may be a single-axis inertial component, for example, may include at least one of a single-axis gyroscope or a single-axis accelerometer. Alternatively, the first inertial component 3 may be a multi-axis inertial component, for example, may include at least one of a multi-axis gyroscope or a multi-axis accelerometer. Alternatively, the first inertial component 3 may include a single-axis gyroscope and a multi-axis accelerometer. Alternatively, the first inertial component 3 may include a multi-axis gyroscope and a single-axis accelerometer.

That a shape of the first mounting part 31 matches a shape of the first alignment part 21 means that an angle of a corner of the first mounting part 31 is the same as an angle of a corner of the first alignment part 21, and the corner of the first mounting part 31 and the corner of the first alignment part 21 are concave and convex: in other words, one of the corner of the first mounting part 31 and the corner of the first alignment part 21 is convex, and the other is concave. In this way, the corner of the first mounting part 31 and the corner of the first alignment part 21 can be fully engaged: in other words, the first mounting part 31 and the first alignment part 21 can be accurately aligned and connected.

The corner of the first mounting part 31 is a portion at which edges of the first mounting part 31 are connected. The corner of the first mounting part 31 generally includes two adjacent surfaces in the first mounting part 31, and the angle of the corner of the first mounting part 31 is an included angle between the two surfaces. The corner of the first alignment part 21 is a portion at which edges of the first alignment part 21 are connected. The corner of the first alignment part 21 generally includes two adjacent surfaces in the first alignment part 21, and the angle of the corner of the first alignment part 21 is an included angle between the two surfaces.

Optionally, the corner of the first alignment part 21 may be convex. For example, a groove may be disposed on the surface that is of the bottom plate 2 and that faces the packaging space 4. A groove wall of the groove and a partial surface, adjacent to the groove, on the surface that is of the bottom plate 2 and that faces the packaging space 4 may form the corner of the first alignment part 21. In this case, the corner of the first mounting part 31 may be concave. In this way, the corner of the first mounting part 31 and the corner of the first alignment part 21 can be fully engaged.

When the first mounting part 31 is connected to the first alignment part 21, the first mounting part 31 may be pasted to the first alignment part 21. The first mounting part 31 and the first alignment part 21 may alternatively be connected in another manner. This is not limited in this embodiment of this application.

The mounting the first inertial component 3 on the bottom plate 2 at the preset angle means that after the first inertial component 3 is mounted on the bottom plate 2, an included angle between a stacking surface of the first inertial component 3 and the surface that is of the bottom plate 2 and that faces the packaging space 4 is the preset angle. The stacking surface of the first inertial component 3 is a surface on which layers of the first inertial component 3 are stacked with adjacent layers.

The angle of the corner of the first mounting part 31 and the angle of the corner of the first alignment part 21 may be the same as or different from the preset angle. In a possible implementation, both the angle of the corner of the first mounting part 31 and the angle of the corner of the first alignment part 21 are the same as the preset angle. In this implementation, an angle at which the first inertial component 3 is mounted on the bottom plate 2 is the same as the angle of the corner of the first mounting part 31 and the angle of the corner of the first alignment part 21. In another possible implementation, neither the angle of the corner of the first mounting part 31 nor the angle of the corner of the first alignment part 21 is necessarily related to the preset angle: in other words, the first inertial component 3 is mounted on the bottom plate 2 at a fixed preset angle regardless of the angle of the corner of the first mounting part 31 and the angle of the corner of the first alignment part 21.

Optionally, the preset angle is 90 degrees: in other words, the first inertial component 3 is mounted on the bottom plate 2 at 90 degrees. In other words, after the first inertial component 3 is mounted on the bottom plate 2, the included angle between the stacking surface of the first inertial component 3 and the surface that is of the bottom plate 2 and that faces the packaging space 4 is 90 degrees. In this case, the first inertial component 3 is vertically mounted on the bottom plate 2.

In this embodiment of this application, after the first mounting part 31 in the first inertial component 3 is connected to the first alignment part 21 on the surface that is of the bottom plate 2 and that faces the packaging space 4, the first inertial component 3 is mounted on the bottom plate 2 at the preset angle. In other words, the MEMS device in this embodiment of this application is equipped with a mounting alignment reference, and therefore, the first inertial component 3 can be mounted on the bottom plate 2 at the preset angle. The associated process is simple and mounting costs are relatively low. In addition, because the first inertial component 3 is mounted on the bottom plate 2 at the preset angle, and a bottom part of the first inertial component 3 is not directly connected to the bottom plate 2, this reduces bias errors caused by packaging stress. In addition, because flatness and angle precision of both the first mounting part 31 and the first alignment part 21 are relatively high, this reduces an assembly error, so that calibration and compensation costs in later testing can be reduced.

Further, as shown in FIG. 1, the MEMS device may further include a second inertial component 5, and the second inertial component 5 is located in the packaging space 4. There is a second alignment part (not shown in the figure) on the surface that is of the bottom plate 2 and that faces the packaging space 4, and the second inertial component 5 has a second mounting part (not shown in the figure). A shape of the second alignment part matches a shape of the second mounting part. The second mounting part is connected to the second alignment part, so that the second inertial component 5 is mounted on the bottom plate 2 at the preset angle.

An electrode of the second inertial component 5 is electrically connected to the electrode on the surface that is of the bottom plate 2 and that faces the packaging space 4, and the electrode on the surface that is of the bottom plate 2 and that faces the packaging space 4 is electrically connected to the pin on the surface that is of the bottom plate 2 and that is away from the packaging space 4.

The second inertial component 5 is a sensor based on the principle of inertia sensitivity, for example, may be an accelerometer or a gyroscope, or may be a combination of an accelerometer and a gyroscope. The second inertial component 5 may be a single-axis inertial component, for example, may include at least one of a single-axis gyroscope or a single-axis accelerometer. Alternatively, the second inertial component 5 may be a multi-axis inertial component, for example, may include at least one of a multi-axis gyroscope or a multi-axis accelerometer. Alternatively, the second inertial component 5 may include a single-axis gyroscope and a multi-axis accelerometer. Alternatively, the second inertial component 5 may include a multi-axis gyroscope and a single-axis accelerometer.

An axial direction of the second inertial component 5 is different from an axial direction of the first inertial component 3. For example, the axial direction of the first inertial component 3 may be a horizontal X-axis, and the axial direction of the second inertial component 5 may be a horizontal Y-axis. The second inertial component 5 and the first inertial component 3 have similar structures, and are also mounted on the bottom plate 2 in similar manners, but axial directions of the second inertial component 5 and the first inertial component 3 are different. In this way, the second inertial component 5 and the first inertial component 3 may detect inertia force in different axial directions.

The axial direction of the first inertial component 3 is an inertia force detection direction of the first inertial component 3. For example, the axial direction of the first inertial component 3 may be an a-axis shown in FIG. 1. The axial direction of the second inertial component 5 is an inertia force detection direction of the second inertial component 5. For example, the axial direction of the second inertial component 5 may be a b-axis shown in FIG. 1.

That a shape of the second mounting part matches a shape of the second alignment part means that an angle of a corner of the second mounting part is the same as an angle of a corner of the second alignment part, and the corner of the second mounting part and the corner of the second alignment part are concave and convex: in other words, one of the corner of the second mounting part and the corner of the second alignment part is convex, and the other is concave. In this way, the corner of the second mounting part and the corner of the second alignment part can be fully engaged: in other words, the second mounting part and the second alignment part can be accurately aligned and connected.

The corner of the second mounting part is a portion at which edges of the second mounting part are connected. The corner of the second mounting part generally includes two adjacent surfaces in the second mounting part, and the angle of the corner of the second mounting part is an included angle between the two surfaces. The corner of the second alignment part is a portion at which edges of the second alignment part are connected. The corner of the second alignment part generally includes two adjacent surfaces in the second alignment part, and the angle of the corner of the second alignment part is an included angle between the two surfaces.

Optionally, the corner of the second alignment part may be convex. For example, a groove may be disposed on the surface that is of the bottom plate 2 and that faces the packaging space 4. A groove wall of the groove and a partial surface, adjacent to the groove, on the surface that is of the bottom plate 2 and that faces the packaging space 4 may form the corner of the second alignment part. In this case, the corner of the second mounting part may be concave. In this way, the corner of the second mounting part and the corner of the second alignment part can be fully engaged.

When the second mounting part is connected to the second alignment part, the second mounting part may be pasted to the second alignment part. The second mounting part and the second alignment part may alternatively be connected in another manner. This is not limited in this embodiment of this application.

The mounting the second inertial component 5 on the bottom plate 2 at the preset angle means that after the second inertial component 5 is mounted on the bottom plate 2, an included angle between a stacking surface of the second inertial component 5 and the surface that is of the bottom plate 2 and that faces the packaging space 4 is the preset angle. The stacking surface of the second inertial component 5 is a surface on which layers of the second inertial component 5 are stacked with adjacent layers.

The angle of the corner of the second mounting part and the angle of the corner of the second alignment part may be the same as or different from the preset angle. In a possible implementation, both the angle of the corner of the second mounting part and the angle of the corner of the second alignment part are the same as the preset angle. In this implementation, an angle at which the second inertial component 5 is mounted on the bottom plate 2 is the same as the angle of the corner of the second mounting part and the angle of the corner of the second alignment part. In another possible implementation, neither the angle of the corner of the second mounting part nor the angle of the corner of the second alignment part is necessarily related to the preset angle: in other words, the second inertial component 5 is mounted on the bottom plate 2 at a fixed preset angle regardless of the angle of the corner of the second mounting part and the angle of the corner of the second alignment part.

Optionally, the preset angle is 90 degrees: in other words, the second inertial component 5 is mounted on the bottom plate 2 at 90 degrees. In other words, after the second inertial component 5 is mounted on the bottom plate 2, the included angle between the stacking surface of the second inertial component 5 and the surface that is of the bottom plate 2 and that faces the packaging space 4 is 90 degrees. In this case, the second inertial component 5 is vertically mounted on the bottom plate 2.

In this embodiment of this application, after the second mounting part in the second inertial component 5 is connected to the second alignment part on the surface that is of the bottom plate 2 and that faces the packaging space 4, the second inertial component 5 is mounted on the bottom plate 2 at the preset angle. In other words, the MEMS device in this embodiment of this application is equipped with a mounting alignment reference, and therefore, the second inertial component 5 can be mounted on the bottom plate 2 at the preset angle. The associated process is simple and mounting costs are relatively low. In addition, because the second inertial component 5 is mounted on the bottom plate 2 at the preset angle, and a bottom part of the second inertial component 5 is not directly connected to the bottom plate 2, this reduces bias errors caused by packaging stress. In addition, because flatness and angle precision of both the second mounting part and the second alignment part are relatively high, this reduces an assembly error, so that calibration and compensation costs in later testing can be reduced. In addition, because both the first inertial component 3 and the second inertial component 5 are packaged in the package 1, a quantity of used packaging packages is reduced, packaging costs are significantly reduced, a packaging volume is reduced, and an integration level is improved.

Further, as shown in FIG. 1, the MEMS device further includes a third inertial component 6, and the third inertial component 6 is located in the packaging space 4. The third inertial component 6 is mounted on the bottom plate 2, and a stacking surface of the third inertial component 6 is parallel to the surface that is of the bottom plate 2 and that faces the packaging space 4.

An electrode of the third inertial component 6 is electrically connected to the electrode on the surface that is of the bottom plate 2 and that faces the packaging space 4, and the electrode on the surface that is of the bottom plate 2 and that faces the packaging space 4 is electrically connected to the pin on the surface that is of the bottom plate 2 and that is away from the packaging space 4.

The third inertial component 6 is a sensor based on the principle of inertia sensitivity, for example, may be an accelerometer or a gyroscope, or may be a combination of an accelerometer and a gyroscope. The third inertial component 6 may be a single-axis inertial component, for example, may include at least one of a single-axis gyroscope or a single-axis accelerometer. Alternatively, the third inertial component 6 may be a multi-axis inertial component, for example, may include at least one of a multi-axis gyroscope or a multi-axis accelerometer. Alternatively, the third inertial component 6 may include a single-axis gyroscope and a multi-axis accelerometer. Alternatively, the third inertial component 6 may include a multi-axis gyroscope and a single-axis accelerometer.

That the third inertial component 6 is mounted on the bottom plate 2 and a stacking surface of the third inertial component 6 is parallel to the surface that is of the bottom plate 2 and that faces the packaging space 4 means that the third inertial component 6 is horizontally mounted on the bottom plate 2. In this case, a bottom part of the third inertial component 6 is connected to the surface that is of the bottom plate 2 and that faces the packaging space 4.

An axial direction of the third inertial component 6 may be different from the axial direction of the second inertial component 5 and the axial direction of the first inertial component 3. In this way, the third inertial component 6, the second inertial component 5, and the first inertial component 3 may detect inertia force in different axial directions. The axial direction of the third inertial component 6 is an inertia force detection direction of the third inertial component 6. For example, the axial direction of the third inertial component 6 may be a c-axis shown in FIG. 1.

In a possible case, all the third inertial component 6, the second inertial component 5, and the first inertial component 3 may be single-axis inertial components. For example, the axial direction of the third inertial component 6 may be a vertical Z-axis, the axial direction of the second inertial component 5 may be the horizontal Y-axis, and the axial direction of the first inertial component 3 may be the horizontal X-axis. In this way, precision of the MEMS device can be improved.

In another possible case, the third inertial component 6 may be a multi-axis inertial component, and the first inertial component 3 may be a single-axis inertial component. For example, axial directions of the third inertial component 6 may be the horizontal Y-axis and the vertical Z-axis, and the axial direction of the first inertial component 3 may be the horizontal X-axis. In this way, a packaging volume can be reduced.

Figure 2:
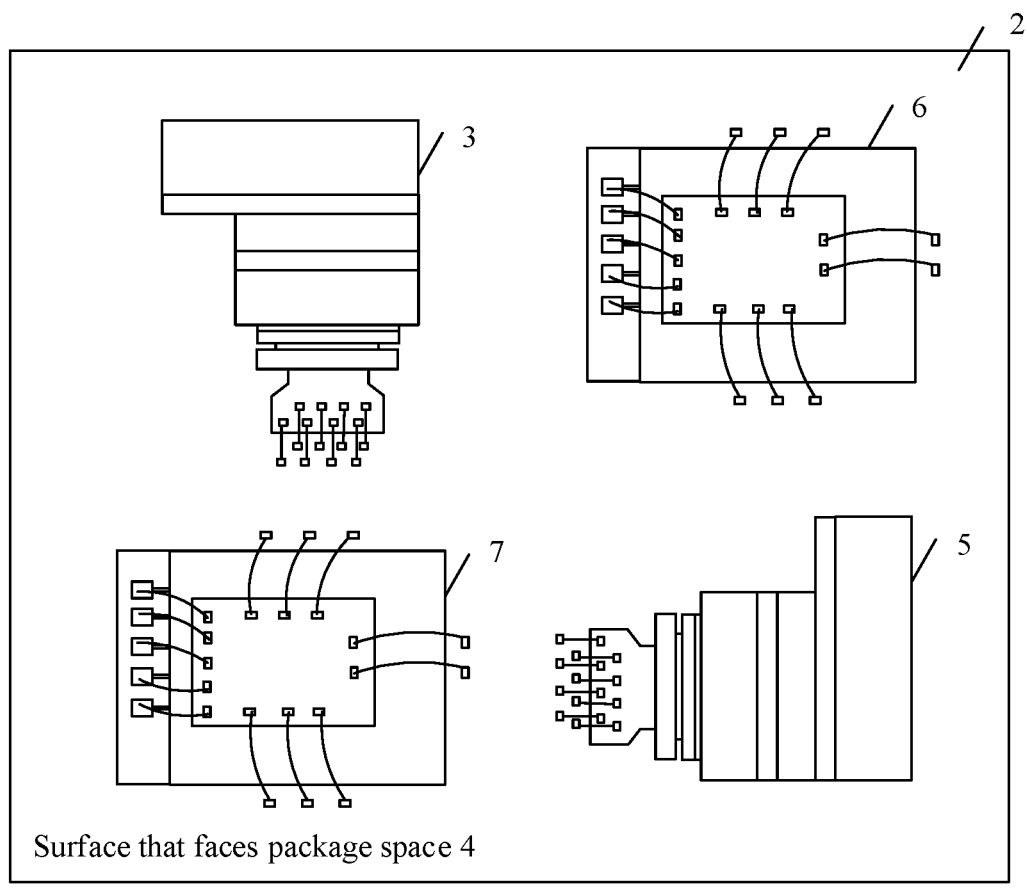
FIG. 2 is a top view of a structure of a MEMS device according to an embodiment of this application.

Further, refer to a top view of the MEMS device shown in FIG. 2. The MEMS device may further include a fourth inertial component 7, and the fourth inertial component 7 is located in the packaging space 4. The fourth inertial component 7 is mounted on the bottom plate 2, and a stacking surface of the fourth inertial component 7 is parallel to the surface that is of the bottom plate 2 and that faces the packaging space 4.

An electrode of the fourth inertial component 7 is electrically connected to the electrode on the surface that is of the bottom plate 2 and that faces the packaging space 4, and the electrode on the surface that is of the bottom plate 2 and that faces the packaging space 4 is electrically connected to the pin on the surface that is of the bottom plate 2 and that is away from the packaging space 4.

That the fourth inertial component 7 is mounted on the bottom plate 2 and a stacking surface of the fourth inertial component 7 is parallel to the surface that is of the bottom plate 2 and that faces the packaging space 4 means that the fourth inertial component 7 is horizontally mounted on the bottom plate 2. In this case, a bottom part of the fourth inertial component 7 is connected to the surface that is of the bottom plate 2 and that faces the packaging space 4. The fourth inertial component 7 is a sensor based on the principle of inertia sensitivity, for example, may be a three-axis inertial component.

Figure 3:
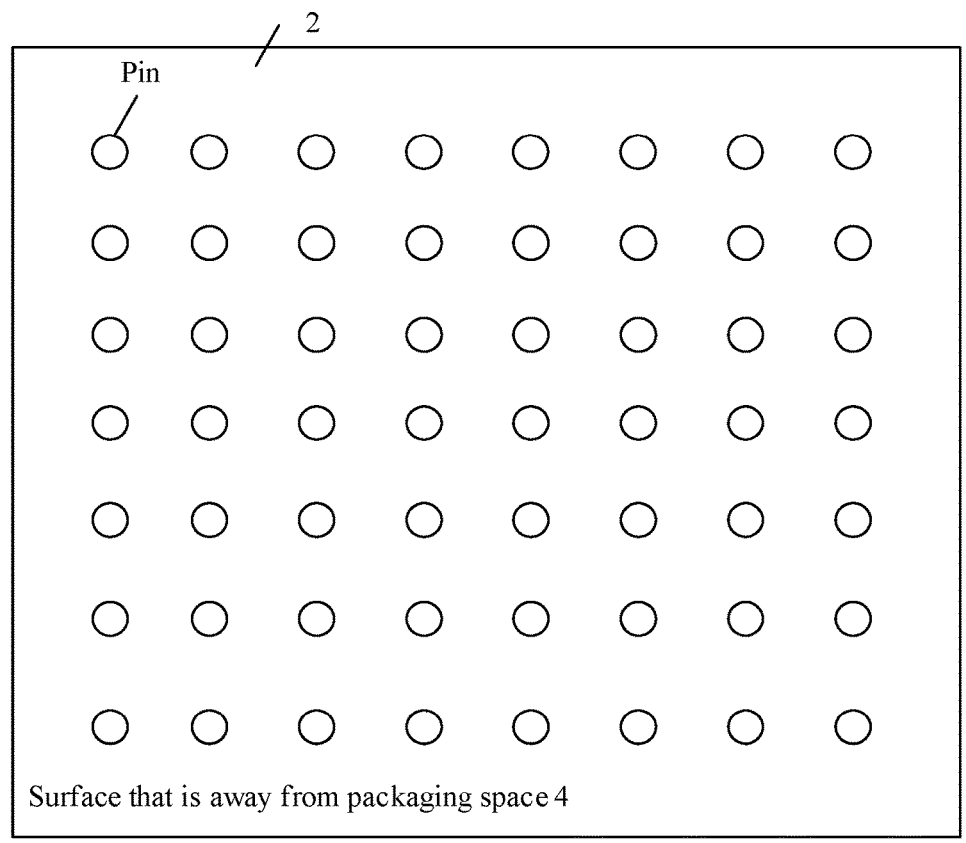
FIG. 3 is a bottom view of a structure of a MEMS device according to an embodiment of this application.

Refer to a bottom view of the MEMS device shown in FIG. 3. An electrical signal in each inertial component in the packaging space 4 is led out by using the one or more pins on the surface that is of the bottom plate 2 and that is away from the packaging space 4. A pin array shown in FIG. 3 may be formed on the surface that is of the bottom plate 2 and that is away from the packaging space 4, and the pin array may be a ball grid array (BGA) or the like.

In a possible implementation, the axial direction of the first inertial component 3 may be the horizontal X-axis. The axial direction of the second inertial component 5 may be the horizontal Y-axis. The axial direction of the third inertial component 6 may be the vertical Z-axis. Axial directions of the fourth inertial component 7 may be the horizontal X-axis, the horizontal Y-axis, and the vertical Z-axis. In this case, all the first inertial component 3, the second inertial component 5, and the third inertial component 6 may be gyroscopes, and the fourth inertial component 7 may be an accelerometer: or all the first inertial component 3, the second inertial component 5, and the third inertial component 6 may be accelerometers, and the fourth inertial component 7 may be a gyroscope. In this case, the MEMS device may be referred to as an inertial measurement unit.

In this application, SIP is used to perform three-dimensional assembly of a plurality of inertial components in the same packaging space 4, so that an integration level is improved, and sizes of the MEMS device in three directions: the X-axis, the Y-axis, and the Z-axis are reduced. In this embodiment of this application, based on a precise mounting alignment technology, a plurality of existing packaging packages are reduced to only one packaging package, and costs and a volume are reduced while precision is ensured. In addition, a precise mounting alignment technology based on the bottom plate 2 reduces a mounting error during multi-axis assembly, so that a cross-axis coupling error of the MEMS device is reduced. Therefore, not only difficulty of calibration and compensation in later testing can be reduced, and costs can be reduced, but performance consistency of the MEMS device can also be improved. In this way, a small-size, cost-effective, and high-precision MEMS device can be obtained.

The MEMS device provided in this embodiment of this application has relatively high precision, and may be used as a vehicle-mounted inertial measurement unit to measure linear motion and rotation of a vehicle in a driving process. Precision of the vehicle-mounted inertial measurement unit directly determines vehicle positioning precision in a case of no GPS signal or a weak GPS signal. Packaging costs and calibration and compensation costs in testing of the inertial measurement unit provided in this embodiment of this application are both relatively low; and costs of the inertial measurement unit are approximately 1/10 of an existing inertial measurement unit with same precision.

A specific structure of the first inertial component 3 is explained and described below:

As shown in FIG. 1, the first inertial component 3 includes an inertial device 32, a flexible substrate 33, and a processor 34. The inertial device 32 and a first portion 331 of the flexible substrate 33 are sequentially stacked with and connected to the processor 34, the inertial device 32 has the first mounting part 31, and a second portion 332 of the flexible substrate 33 except the first portion 331 is connected to the surface that is of the bottom plate 2 and that faces the packaging space 4. A first electrode of the inertial device 32 is electrically connected to a first output electrode of the processor 34, a second electrode of the inertial device 32 is electrically connected to an input electrode of the processor 34, a second output electrode of the processor 34 is electrically connected to an electrode of the first portion 331 of the flexible substrate 33, the electrode of the first portion 331 of the flexible substrate 33 is electrically connected to an electrode of the second portion 332 of the flexible substrate 33, and the electrode of the second portion 332 of the flexible substrate 33 is electrically connected to an electrode on the surface that is of the bottom plate 2 and that faces the packaging space 4.

The inertial device 32 is a part based on the principle of inertia sensitivity, and may output an inertial signal (for example, an acceleration signal or an angular velocity signal). When the inertial device 32 outputs an acceleration signal, the first inertial component 3 is an accelerometer. When the inertial device 32 outputs an angular velocity signal, the first inertial component 3 is a gyroscope. When the inertial device 32 outputs an acceleration signal and an angular velocity signal, the first inertial component 3 is a combination of an accelerometer and a gyroscope.

The flexible substrate 33 can be bent, and the flexible substrate 33 may be bent to form the first portion 331 and the second portion 332. The first portion 331 and the second portion 332 of the flexible substrate 33 are not in a same plane, and the first portion 331 and the second portion 332 form a specific angle. The angle may be the same as or close to the preset angle. In this way, the first portion 331 of the flexible substrate 33 is stacked with and connected to the inertial device 32 and the processor 34, and the second portion 332 of the flexible substrate 33 is independent of the first portion 331 of the flexible substrate 33 and connected to the surface that is of the bottom plate 2 and that faces the packaging space 4.

The processor 34 may be a microprocessor (including a central processing unit (CPU) or the like), an application-specific integrated circuit (ASIC), or the like. The processor 34 is configured to input an excitation signal to the inertial device 32 and process an inertial signal output by the inertial device 32. The inertial device 32 may detect inertia force under an action of the excitation signal to obtain an inertial signal, and the inertial signal may include an acceleration signal and/or an angular velocity signal. The processor 34 may process the acceleration signal to obtain a velocity signal and a displacement signal, and process the angular velocity signal to obtain an angle signal.

In this case, the processor 34 outputs the excitation signal to the first electrode of the inertial device 32 by using the first output electrode of the processor 34. The inertial device 32 may detect inertia force under an action of the excitation signal to obtain an inertial signal, and output the inertial signal to the input electrode of the processor 34 by using the second electrode of the inertial device 32. The processor 34 processes the inertial signal, outputs the processed inertial signal to the flexible substrate 33 by using the second output electrode of the processor 34, and then outputs the processed inertial signal to the bottom plate 2 by using the flexible substrate 33. In this way, when the first inertial component 3 is mounted on the bottom plate 2 at the preset angle, the inertial signal in the first inertial component 3 can also be successfully output to the bottom plate 2. The associated process is simple and costs are relatively low:

When the inertial device 32 is stacked with and connected to the first portion 331 of the flexible substrate 33, the first portion 331 of the flexible substrate 33 may be pasted to the inertial device 32. When the first portion 331 of the flexible substrate 33 is stacked with and connected to the processor 34, the processor 34 may be pasted to the first portion 331 of the flexible substrate 33. Certainly, the inertial device 32, the first portion 331 of the flexible substrate 33, and the processor 34 may alternatively be sequentially stacked and connected in another manner. This is not limited in this embodiment of this application.

When the second portion 332 of the flexible substrate 33 except the first portion 331 is connected to the surface that is of the bottom plate 2 and that faces the packaging space 4, the second portion 332 of the flexible substrate 33 may be pasted to the surface that is of the bottom plate 2 and that faces the packaging space 4. Certainly, the second portion 332 of the flexible substrate 33 and the surface that is of the bottom plate 2 and that faces the packaging space 4 may alternatively be connected in another manner. This is not limited in this embodiment of this application.

Figure 4:
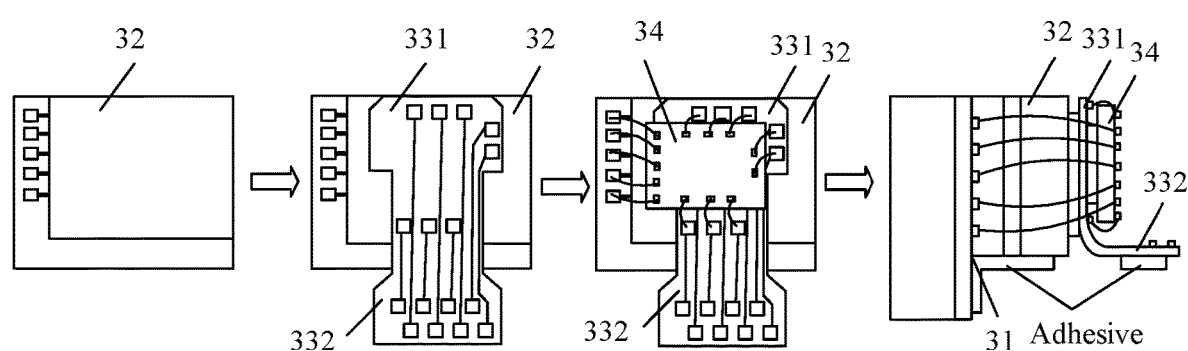
FIG. 4 is a schematic diagram of a structure of a first inertial component according to an embodiment of this application.

In a possible manner, as shown in FIG. 4, a gold wire bonding process may be used, so that the first electrode and the second electrode are formed on the inertial device 32, the electrode is formed on the first portion 331 of the flexible substrate 33, and the electrode is formed on the second portion 332 of the flexible substrate 33; and the electrode of the first portion 331 of the flexible substrate 33 is electrically connected to the electrode of the second portion 332, and the input electrode, the first output electrode, and the second output electrode are formed on the processor 34. Then, the first portion 331 of the flexible substrate 33 is first pasted to the inertial device 32, and then the processor 34 is pasted to the first portion 331 of the flexible substrate 33. Then, a wire bonding process is used, so that the first electrode of the inertial device 32 is electrically connected to the first output electrode of the processor 34, the second electrode of the inertial device 32 is electrically connected to the input electrode of the processor 34, and the second output electrode of the processor 34 is electrically connected to the electrode of the first portion 331 of the flexible substrate 33. Then, the first mounting part 31 of the inertial device 32 is pasted to the first alignment part 21 on the surface that is of the bottom plate 2 and that faces the packaging space 4, and the second portion 332 of the flexible substrate 33 is pasted to the surface that is of the bottom plate 2 and that faces the packaging space 4. Finally, the wire bonding process is used, so that the electrode of the second portion 332 of the flexible substrate 33 is electrically connected to the electrode on the surface that is of the bottom plate 2 and that faces the packaging space 4.

The inertial device 32 may be obtained through wafer-level packaging (WLP). A structure of the inertial device 32 is explained and described below.

Figure 5:
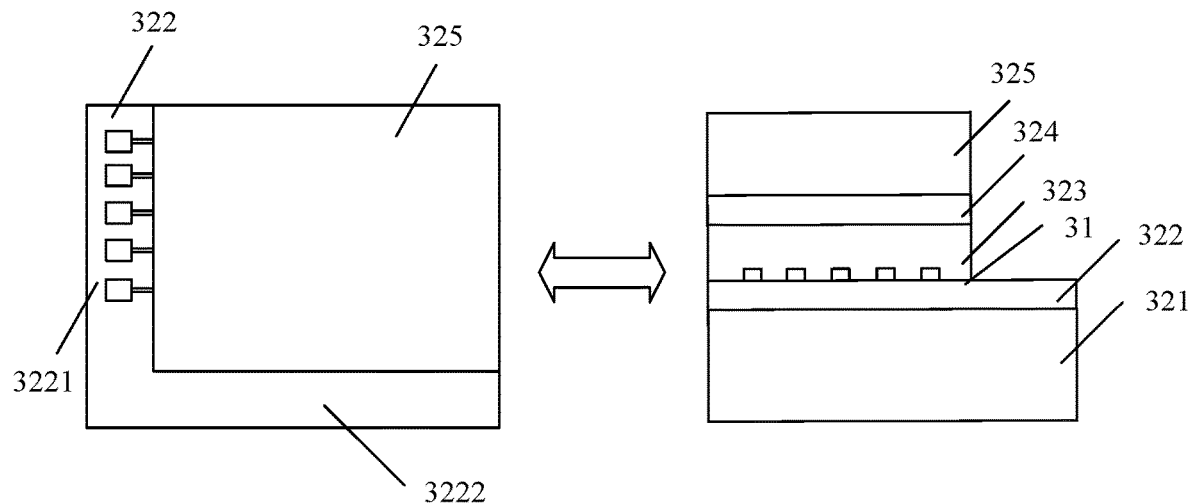
FIG. 5 is a schematic diagram of a structure of an inertial device according to an embodiment of this application.

Refer to a top view of the inertial device 32 shown by a left figure in FIG. 5 and a left view of the inertial device 32 shown by a right figure. The inertial device 32 includes a substrate layer 321, a first insulation layer 322, an inertial structure layer 323, a second insulation layer 324, and a cover layer 325. The substrate layer 321, the first insulation layer 322, the inertial structure layer 323, the second insulation layer 324, and the cover layer 325 are sequentially stacked and connected, an input signal of the inertial structure layer 323 is introduced from a first electrode of the first insulation layer 322, and an output signal of the inertial structure layer 323 is led out from a second electrode of the first insulation layer 322. The first electrode of the first insulation layer 322 is electrically connected to the first output electrode of the processor 34, and the second electrode of the first insulation layer 322 is electrically connected to the input electrode of the processor 34.

The substrate layer 321 is configured to support the inertial device 32. A material of the substrate layer 321 may be a material such as silicon, quartz, silicon-on-insulator (SOI), or silicon carbide (SiC). Materials of the first insulation layer 322 and the second insulation layer 324 may be silicon nitride, silicon dioxide, or another insulating material.

The inertial structure layer 323 is configured to generate an inertial signal, and may be an accelerometer structure layer used to generate an acceleration signal, or may be a gyroscope structure layer used to generate an angular velocity signal, or may be a combination of the two. The input signal of the inertial structure layer 323 is an excitation signal output by the processor 34 from the first output electrode of the processor 34. The output signal of the inertial structure layer 323 is an inertial signal obtained after the inertial structure layer 323 detects inertia force under the action of the excitation signal.

An area of the first insulation layer 322 is greater than an area of the inertial structure layer 323, the first insulation layer 322 includes a first edge region 3221 and a second edge region 3222, and another region in the first insulation layer 322 except the first edge region 3221 and the second edge region 3222 is stacked with and connected to the inertial structure layer 323. Both the first electrode and the second electrode of the first insulation layer 322 are located in the first edge region 3221.

A surface that is of the second edge region 3222 and that is close to the inertial structure layer 323 and a side surface that is of the inertial structure layer 323 and that is close to the second edge region 3222 form the corner of the first mounting part 31. In other words, the second edge region 3222 has an upper surface and a lower surface that are opposite to each other and a plurality of side surfaces adjacent to the two surfaces. The inertial structure layer 323 has an upper stacking surface and a lower stacking surface that are opposite to each other and a plurality of side surfaces adjacent to the two stacking surfaces. A surface that is in the two surfaces of the second edge region 3222 and that is close to the inertial structure layer 323 and a side surface that is in the plurality of side surfaces of the inertial structure layer 323 and that is close to the second edge region 3222 form the corner of the first mounting part 31.

A structure of the second inertial component 5 is similar to the structure of the first inertial component 3. Details are not described again in this embodiment of this application.

A structure of the third inertial component 6 is explained and described below:

As shown in FIG. 1, the third inertial component 6 includes an inertial device 61 and a processor 62. The inertial device 61 is stacked with and connected to the processor 62, a first electrode of the inertial device 61 is electrically connected to a first output electrode of the processor 62, a second electrode of the inertial device 61 is electrically connected to an input electrode of the processor 62, and a second output electrode of the processor 62 is electrically connected to the electrode on the surface that is of the bottom plate 2 and that faces the packaging space 4.

The inertial device 61 is a part based on the principle of inertia sensitivity, and may output an inertial signal (for example, an acceleration signal or an angular velocity signal). When the inertial device 61 outputs an acceleration signal, the third inertial component 6 is an accelerometer.

When the inertial device 61 outputs an angular velocity signal, the third inertial component 6 is a gyroscope. When the inertial device 61 outputs an acceleration signal and an angular velocity signal, the third inertial component 6 is a combination of an accelerometer and a gyroscope.

The processor 62 may be a microprocessor (including a CPU or the like), an ASIC, or the like. The processor 62 is configured to input an excitation signal to the inertial device 61 and process an inertial signal output by the inertial device 61. The inertial device 61 may detect inertia force under an action of the excitation signal to obtain an inertial signal, and the inertial signal may include an acceleration signal and/or an angular velocity signal. The processor 62 may process the acceleration signal to obtain a velocity signal and a displacement signal, and process the angular velocity signal to obtain an angle signal.

In this case, the processor 62 outputs the excitation signal to the first electrode of the inertial device 61 by using the first output electrode of the processor 62. The inertial device 61 may detect inertia force under an action of the excitation signal to obtain an inertial signal, and output the inertial signal to the input electrode of the processor 62 by using the second electrode of the inertial device 61. The processor 62 processes the inertial signal, and outputs the processed inertial signal to the bottom plate 2 by using the second output electrode of the processor 62.

When the inertial device 61 is stacked with and connected to the processor 62, the processor 62 may be pasted to the inertial device 61. Certainly, the inertial device 61 and the processor 62 may alternatively be stacked and connected in another manner. This is not limited in this embodiment of this application.

Figure 6:
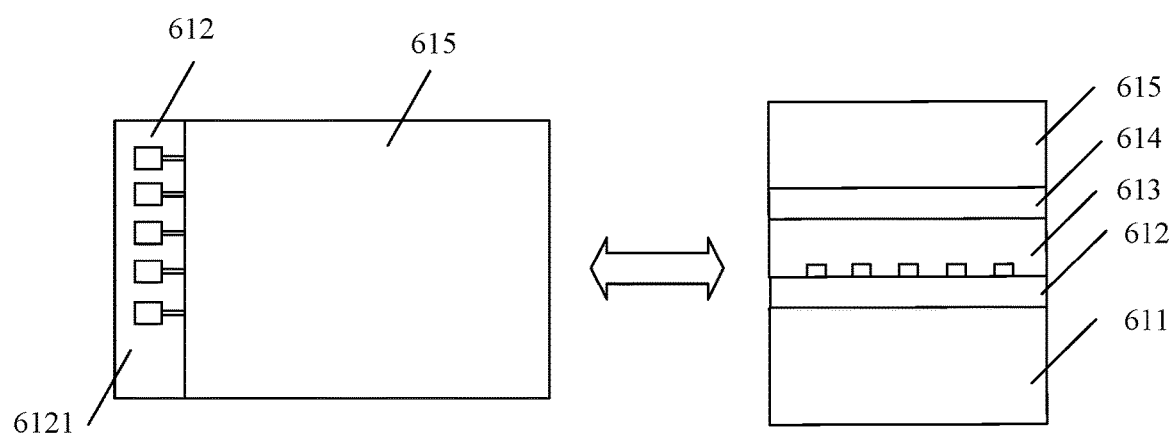
FIG. 6 is a schematic diagram of a structure of another inertial device according to an embodiment of this application.

The inertial device 61 in the third inertial component 6 may be obtained through WLP. A structure of the inertial device 61 is explained and described below:

Refer to a top view of the inertial device 61 shown by a left figure in FIG. 6 and a left view of the inertial device 61 shown by a right figure. The inertial device 61 includes a substrate layer 611, a first insulation layer 612, an inertial structure layer 613, a second insulation layer 614, and a cover layer 615. The substrate layer 611, the first insulation layer 612, the inertial structure layer 613, the second insulation layer 614, and the cover layer 615 are sequentially stacked and connected, an input signal of the inertial structure layer 613 is introduced from a first electrode of the first insulation layer 612, and an output signal of the inertial structure layer 613 is led out from a second electrode of the first insulation layer 612. The first electrode of the first insulation layer 612 is electrically connected to the first output electrode of the processor 62, and the second electrode of the first insulation layer 612 is electrically connected to the input electrode of the processor 62.

The substrate layer 611 is configured to support the inertial device 61. A material of the substrate layer 611 may be a material such as silicon, quartz, SOI, or SiC. Materials of the first insulation layer 612 and the second insulation layer 614 may be silicon nitride, silicon dioxide, or another insulating material.

The inertial structure layer 613 is configured to generate an inertial signal, and may be an accelerometer structure layer used to generate an acceleration signal, or may be a gyroscope structure layer used to generate an angular velocity signal, or may be a combination of the two. The input signal of the inertial structure layer 613 is an excitation signal output by the processor 62 from the first output electrode of the processor 62. The output signal of the inertial structure layer 613 is an inertial signal obtained after the inertial structure layer 613 detects inertia force under the action of the excitation signal.

An area of the first insulation layer 612 is greater than an area of the inertial structure layer 613. The first insulation layer 612 includes a first edge region 6121, and another region in the first insulation layer 612 except the first edge region 6121 is stacked with and connected to the inertial structure layer 613. Both the first electrode and the second electrode of the first insulation layer 612 are located in the first edge region 6121.

The structure of the fourth inertial component 7 is similar to the structure of the third inertial component 6. Details are not described again in this embodiment of this application.

Further, refer to FIG. 1. The MEMS device further includes a passive device 8, the passive device 8 is located inside the bottom plate 2 and is electrically connected between the electrode on the surface that is of the bottom plate 2 and that faces the packaging space 4 and the pin on the surface that is of the bottom plate 2 and that is away from the packaging space 4.

The passive device 8 is configured to process an electrical signal input from the electrode on the surface that is of the bottom plate 2 and that faces the packaging space 4, or is configured to support working of an inertial component, or the like. The passive device 8 may include a capacitor, a resistor, an inductor, a crystal oscillator, and the like, and may be configured to boost a voltage of an electrical signal, filter out a power ripple, increase an operating voltage of the inertial component, and the like.

Further, refer to FIG. 1. The MEMS device further includes an active device 9, the active device 9 is located on the surface that is of the bottom plate 2 and that faces the packaging space 4 and is electrically connected between the electrode on the surface that is of the bottom plate 2 and that faces the packaging space 4 and the pin on the surface that is of the bottom plate 2 and that is away from the packaging space 4. For example, the active device 9 may be electrically connected between the passive device 8 and the pin on the surface that is of the bottom plate 2 and that is away from the packaging space 4.

The active device 9 is configured to process an electrical signal input from the electrode on the surface that is of the bottom plate 2 and that faces the packaging space 4, or is configured to support working of an inertial component, or the like. The active device 9 may include a microcontroller unit (MCU), a voltage regulator, a voltage conversion device, a serial port device, a power management device, and the like, and is configured to: perform real-time processing and calculation on an electrical signal that is output by the inertial component, output the electrical signal to an external system, and provide velocity information, gesture information, and the like.

In this embodiment of this application, the passive device 8 may be buried in the bottom plate 2, and the active device 9 may be attached to a surface, so that more devices can be integrated into the limited packaging space 4 to implement more functions and further improve an integration level.

Figure 7:
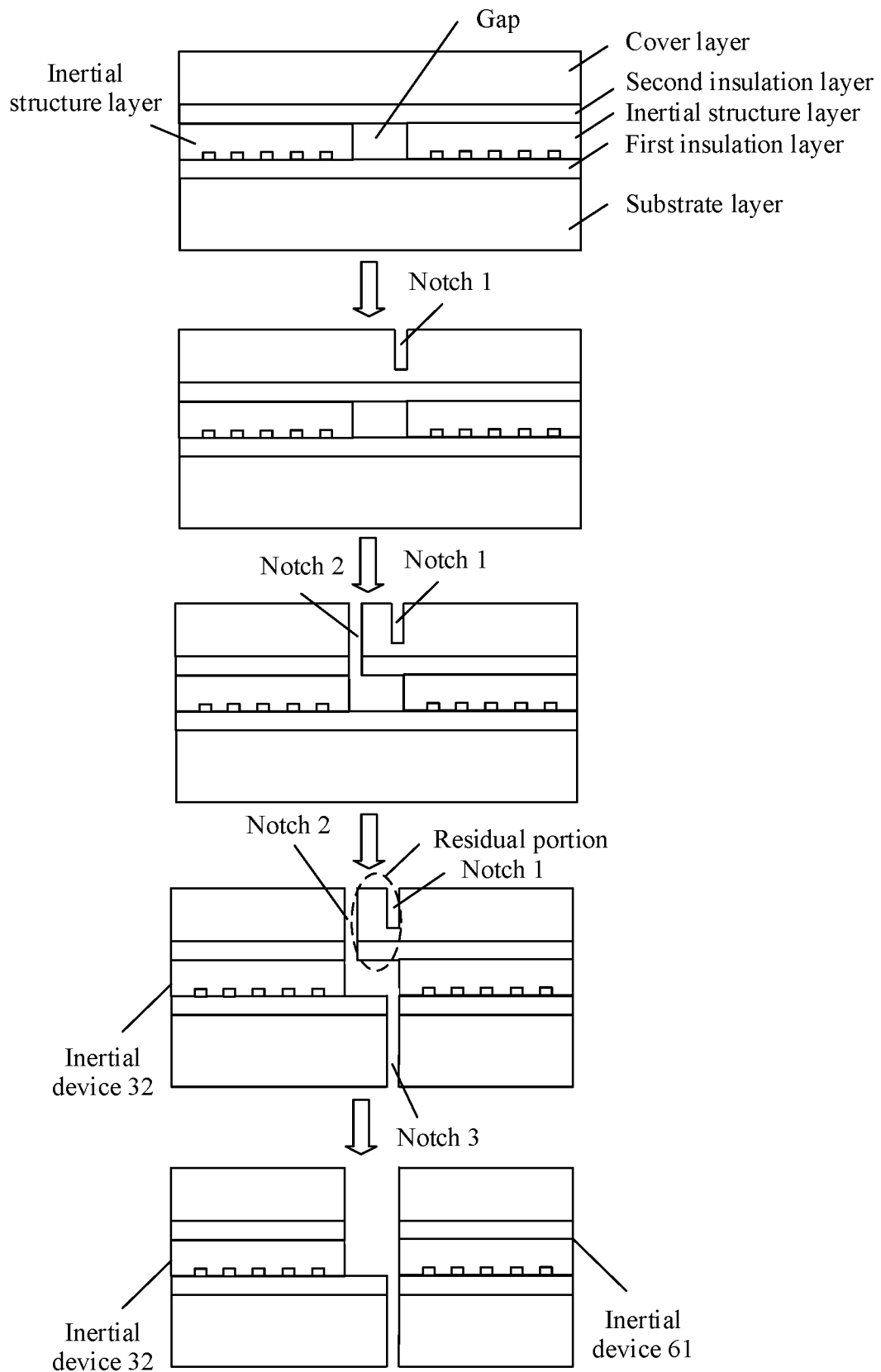
FIG. 7 is a schematic diagram of a process of preparing an inertial device according to an embodiment of this application.

A process of preparing the inertial device in this embodiment of this application is described below:

FIG. 7 is a schematic diagram of a process of preparing an inertial device according to an embodiment of this application. A conventional inertial device (that is, the inertial device 61 in the third inertial component 6 and the fourth inertial component 7) and an inertial device with a vertical alignment reference (that is, the inertial device 32 in the first inertial component 3 and the second inertial component 5) may be simultaneously prepared. A process of preparing the two inertial devices is as follows:

A first insulation layer is formed on a substrate layer, and two inertial structure layers are formed on the first insulation layer. There is a gap between the two inertial structure layers, and a sacrificial layer is filled in the gap. A second insulation layer is formed on the two inertial structure layers and the sacrificial layer, a cover layer is formed on the second insulation layer, and the sacrificial layer is removed.

The cover layer 325 is diced and segmented along a plane in which a sidewall that is in a first inertial structure layer and that is located in the gap is located. A segmentation length is less than thickness of the cover layer 325: in other words, the cover layer 325 is not cut through, to form a notch 1.

The cover layer 325 and the second insulation layer 324 are diced and segmented along a plane in which a sidewall that is in a second inertial structure layer 323 and that is located in the gap is located, and the cover layer 325 and the second insulation layer 324 are segmented to an inner side of the gap to form a notch 2.

The substrate layer 321 and the first insulation layer 322 are diced and segmented along the plane in which the sidewall that is in the first inertial structure layer 323 and that is located in the gap is located, and the substrate layer 321 and the first insulation layer 322 are segmented to the inner side of the gap to form a notch 3.

In this way, a left portion and a right portion that are separated from each other are obtained. The left portion is the inertial device 32 with the vertical alignment reference. For the right portion, the cover layer 325 and the second insulation layer 324 are further diced and segmented along the notch 1, and are segmented to the inner side of the gap. A residual portion of a material that is obtained through segmentation and that includes the cover layer 325 and the second insulation layer 324 is discarded, and a remaining portion is the conventional inertial device 61.

In this embodiment of this application, the inertial device 32 with the vertical alignment reference is prepared through dicing and segmentation. Because both flatness and verticality of a segmentation surface are relatively high, this reduces an assembly error and a cross-axis coupling error. Therefore, it is possible to implement slight calibration compensation or calibration-free compensation of a high-precision MEMS device, and reduce costs of the MEMS device.

FIG. 1 is a schematic diagram of a structure of a MEMS device according to an embodiment of this application. FIG. 1 is specifically a front sectional view of the MEMS device. As shown in FIG. 1, the MEMS device includes a package 1, a bottom plate 2, and a first inertial component 3.

The bottom plate 2 and the package 1 form packaging space 4, and the first inertial component 3 is located in the packaging space 4. The first inertial component 3 is mounted on the bottom plate 2 at a preset angle, and the preset angle is greater than 0 degrees and less than 180) degrees.

The first inertial component 3 includes an inertial device 32, a flexible substrate 33, and a processor 34. The inertial device 32 and a first portion 331 of the flexible substrate 33 are sequentially stacked with and connected to the processor 34, and a second portion 332 of the flexible substrate 33 except the first portion 331 is connected to a surface that is of the bottom plate 2 and that faces the packaging space 4. A first electrode of the inertial device 32 is electrically connected to a first output electrode of the processor 34, a second electrode of the inertial device 32 is electrically connected to an input electrode of the processor 34, a second output electrode of the processor 34 is electrically connected to an electrode of the first portion 331 of the flexible substrate 33, the electrode of the first portion 331 of the flexible substrate 33 is electrically connected to an electrode of the second portion 332 of the flexible substrate 33, and the electrode of the second portion 332 of the flexible substrate 33 is electrically connected to an electrode on the surface that is of the bottom plate 2 and that faces the packaging space 4.

In this embodiment of this application, an inertial signal generated by the inertial device 32 in the first inertial component 3 is output to the processor 34. After processing the inertial signal, the processor 34 may output the processed inertial signal to the bottom plate 2 by using the flexible substrate 33. In this way, when the first inertial component 3 is mounted on the bottom plate 2 at the preset angle, the inertial signal in the first inertial component 3 can also be successfully output to the bottom plate 2. The associated process is simple and costs are relatively low: In addition, because the first inertial component 3 is mounted on the bottom plate 2 at the preset angle, and a bottom part of the first inertial component 3 is not directly connected to the bottom plate 2, this reduces bias errors caused by packaging stress.

Optionally, there is a first alignment part 21 on the surface that is of the bottom plate 2 and that faces the packaging space 4, the inertial device 32 has a first mounting part 31, and a shape of the first mounting part 31 matches a shape of the first alignment part 21. The first mounting part 31 is connected to the first alignment part 21, to mount the first inertial component 3 on the bottom plate 2 at the preset angle.

For related descriptions of each part in the MEMS device, refer to the foregoing embodiments. Details are not described again in this embodiment of this application.

The foregoing descriptions are merely embodiments of this application, but are not intended to limit this application. Any modification, equivalent replacement, or improvement made without departing from the spirit and principle of this application should fall within the protection scope of this application.

What is claimed is:

1. A micro electro mechanical system (MEMS) device, wherein the MEMS device comprises: a package, a bottom plate, and a first inertial component;
    the bottom plate and the package form a packaging space between the bottom plate and the package, and the first inertial component is located in the packaging space; and
    there is a first alignment part on a surface that is of the bottom plate and that faces the packaging space, the first inertial component has a first mounting part, a shape of the first mounting part matches a shape of the first alignment part, the first mounting part is connected to the first alignment part to mount the first inertial component on the bottom plate at a preset angle, and the preset angle is greater than 0 degrees and less than 180 degrees.

2. The MEMS device according to claim 1, wherein the preset angle is 90 degrees.

3. The MEMS device according to claim 1, wherein both an angle of a corner of the first alignment part and an angle of a corner of the first mounting part are the same as the preset angle.

4. The MEMS device according to claim 1, wherein the first inertial component comprises an inertial device, a flexible substrate, and a processor;

the inertial device and a first portion of the flexible substrate are sequentially arranged with and connected to the processor, the inertial device has the first mounting part, and a second portion of the flexible substrate that is different from the first portion is connected to the surface that is of the bottom plate and that faces the packaging space; and a first electrode of the inertial device is electrically connected to a first output electrode of the processor, a second electrode of the inertial device is electrically connected to an input electrode of the processor, a second output electrode of the processor is electrically connected to an electrode of the first portion, the electrode of the first portion is electrically connected to an electrode of the second portion, and the electrode of the second portion is electrically connected to an electrode on the surface that is of the bottom plate and that faces the packaging space.

5. The MEMS device according to claim 4, wherein the inertial device comprises a substrate layer, a first insulation layer, an inertial structure layer, a second insulation layer, and a cover layer; and the substrate layer, the first insulation layer, the inertial structure layer, the second insulation layer, and the cover layer are sequentially arranged and connected, an input signal of the inertial structure layer is introduced from a first electrode of the first insulation layer, an output signal of the inertial structure layer is led out from a second electrode of the first insulation layer, the first electrode of the first insulation layer is electrically connected to the first output electrode of the processor, and the second electrode of the first insulation layer is electrically connected to the input electrode of the processor.

6. The MEMS device according to claim 5, wherein an area of the first insulation layer is greater than an area of the inertial structure layer, the first insulation layer comprises a first edge region and a second edge region, and another region in the first insulation layer that is different from the first edge region and the second edge region is stacked with and connected to the inertial structure layer; and both the first electrode and the second electrode of the first insulation layer are located in the first edge region, a surface near the inertial structure layer in the second edge region and a side surface near the second edge region in the inertial structure layer form the corner of the first mounting part.

7. The MEMS device according to claim 1, wherein the MEMS device further comprises a second inertial component, and the second inertial component is located in the packaging space;

there is a second alignment part on the surface that is of the bottom plate and that faces the packaging space, the second inertial component has a second mounting part, a shape of the second alignment part matches a shape of the second mounting part, and the second mounting part is connected to the second alignment part to mount the second inertial component on the bottom plate at the preset angle; and an axial direction of the first inertial component is different from an axial direction of the second inertial component.

8. The MEMS device according to claim 1, wherein the MEMS device further comprises a third inertial component, the third inertial component is located in the packaging space, the third inertial component is mounted on the bottom plate, and a stacking surface of the third inertial component is parallel to the surface that is of the bottom plate and that faces the packaging space.

9. The MEMS device according to claim 1, wherein the first inertial component is a single-axis inertial component or a multi-axis inertial component.

10. The MEMS device according to claim 9, wherein the first inertial component comprises at least one of an accelerometer or a gyroscope.

11. The MEMS device according to claim 1, wherein the MEMS device further comprises a passive device, and the passive device is located inside the bottom plate and is electrically connected between the electrode on the surface that is of the bottom plate and that faces the packaging space and a pin on a surface that is of the bottom plate and that is away from the packaging space.

12. The MEMS device according to claim 1, wherein the MEMS device further comprises an active device, and the active device is located on the surface that is of the bottom plate and that faces the packaging space, and is electrically connected between the electrode on the surface that is of the bottom plate and that faces the packaging space and the pin on the surface that is of the bottom plate and that is away from the packaging space.

13. A micro electro mechanical system (MEMS) device, wherein the MEMS device comprises: a package, a bottom plate, and a first inertial component;

the bottom plate and the package form a packaging space between the bottom plate and the package, the first inertial component is located in the packaging space, the first inertial component is mounted on the bottom plate at a preset angle, and the preset angle is greater than 0 degrees and less than 180 degrees;

the first inertial component comprises an inertial device, a flexible substrate, and a processor, the inertial device and a first portion of the flexible substrate are sequentially arranged with and connected to the processor, and a second portion of the flexible substrate that is different from the first portion is connected to a surface that is of the bottom plate and that faces the packaging space; and a first electrode of the inertial device is electrically connected to a first output electrode of the processor, a second electrode of the inertial device is electrically connected to an input electrode of the processor, a second output electrode of the processor is electrically connected to an electrode of the first portion, the electrode of the first portion is electrically connected to an electrode of the second portion, and the electrode of the second portion is electrically connected to an electrode on the surface that is of the bottom plate and that faces the packaging space.

14. The MEMS device according to claim 13, wherein there is a first alignment part on the surface that is of the bottom plate and that faces the packaging space, the inertial device has a first mounting part, a shape of the first mounting part matches a shape of the first alignment part, and the first mounting part is connected to the first alignment part, to mount the first inertial component on the bottom plate at the preset angle.

* * * * *